United States Patent [19]

Suzuki et al.

[11] Patent Number: 5,272,107

[45] Date of Patent: Dec. 21, 1993

[54] MANUFACTURE OF SILICON CARBIDE (SIC) METAL OXIDE SEMICONDUCTOR (MOS) DEVICE

[75] Inventors: Akira Suzuki, Nara; Katsuki Furukawa, Sakai, both of Japan

[73] Assignee: Sharp Kabushiki Kaisha, Osaka, Japan

[21] Appl. No.: 759,120

[22] Filed: Sep. 9, 1991

Related U.S. Application Data

[63] Continuation of Ser. No. 571,314, Aug. 23, 1990, abandoned, which is a continuation of Ser. No. 382,018, Jul. 18, 1989, abandoned, which is a continuation of Ser. No. 653,777, Sep. 24, 1984, abandoned.

[30] Foreign Application Priority Data

Sep. 24, 1983 [JP] Japan ............................... 58-177482

[51] Int. Cl.$^5$ ........................................ H01L 21/316
[52] U.S. Cl. ........................... 437/100; 437/233; 437/239
[58] Field of Search ............... 437/100, 233, 238, 239; 148/DIG. 148

[56] References Cited

U.S. PATENT DOCUMENTS 3,911,168 10/1975 Schinella et al. ............... 437/239

OTHER PUBLICATIONS

Ghandhi, VLSI Fabrication Principles, John Wiley & Sons, Inc., New York, N.Y. (1983), p. 388.
Jackson et al., "Fabrication of Epitaxial SiC Films on Silicon", Trans. Met. Soc. AIME, vol. 233, pp. 468–472 (Mar. 1965).
Suzuki et al., "C-V characteristics of SiC MOS diodes with a thermal grown SiO$_2$ layer," Appl. Phys. Lett 39(1) Jul. 81.
Suzuki et al. "Thermal Oxidation of SiC and Electrical Properties of Al-ScO$_2$-SiC MOS Structure," Jap J of App Phys vol. 24, Nov. 4, Apr. 82.
DiMaria, "Interface effects and high conductivity in oxides grown from polycrystalline silicon," App Phys Lett vol. 24, No. 9 Nov. 75.
Ghandhi, *VLSI Fabrication, Silicon and Gallium Arsenide*, Wiley-Interscience Publication 1983.

Primary Examiner—Olik Chaudhuri
Assistant Examiner—Ourmazd S. Ojan
Attorney, Agent, or Firm—Birch, Stewart, Kolasch & Birch

[57] ABSTRACT

A silicon thin-film is formed on a silicon carbide (SiC) semiconductor body through the use of the thermal decomposition of monosilane (SiH$_4$) gas. The thus formed silicon thin-film is oxidized by a thermal oxidation method which employs an oxygen gas so as to form a silicon oxide film of about 600 to 1200 Å on the silicon carbide (SiC) semiconductor. The silicon oxide film shows a sharp boundary between the silicon carbide (SiC) semiconductor.

An aluminum electrode is formed on the silicon oxide film, thereby providing a MOS structure on the silicon carbide (SiC) semiconductor.

1 Claim, 1 Drawing Sheet

MANUFACTURE OF SILICON CARBIDE (SiC) METAL OXIDE SEMICONDUCTOR (MOS) DEVICE

This application is a continuation of application Ser. No. 07/571,314 filed on Aug. 23, 1990 which is a continuation of application Ser. No. 07/382,018 filed Jul. 18, 1989 which is a continuation application of Ser. No. 06/653,777 filed Sep. 24, 1984 now all abandoned.

BACKGROUND AND SUMMARY OF THE INVENTION

The present invention relates to a method for manufacturing a metal-oxide-semiconductor (MOS) structure which includes a silicon carbide (SiC) substrate and an oxide film deposited on the SiC substrate.

Silicon carbide (SiC) has a wide band gap (2.2 to 3.3 eV), and is thermally, chemically and mechanically stable, and also tolerant of radiation damage. Accordingly, SiC semiconductor devices such as transistors and diodes formed on an SiC substrate are expected to have stable operation even in a high temperature environment, under a high power operation, and while being exposed to the radiation.

On the other hand, a metal-oxide-semiconductor (MOS) structure is well known in the art, wherein an oxide film is formed on a semiconductor surface. Especially, MOS diodes, MOSFETs and MOSICs formed on a silicon substrate are widely used in the art.

Accordingly, if diodes, transistors of ICs of the MOS structure are effectively formed on the silicon carbide (SiC) substrate, advantages of the silicon carbide and the MOS structure will be combined. However, it is difficult to effectively form an oxide layer on a silicon carbide (SiC) semiconductor. If the conventional thermal oxidation method is employed to form the oxide layer on a silicon carbide (SiC) substrate, the oxidation rate is very slow, and a sharp boundary is not formed between the oxide layer and the silicon carbide (SiC) substrate. Generally, the MOS structure requires a well-insulating oxide layer of 500 through 2000 Å, which forms a sharp boundary between the semiconductor.

Accordingly, an object of the present invention is to provide a novel method for effectively forming a MOS structure on a silicon carbide (SiC) semiconductor substrate.

Another object of the present invention is to effectively form an oxide layer on a silicon carbide (SiC) semiconductor substrate.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a silicon thin-film is deposited on a silicon carbide (SiC) semiconductor. The silicon thin-film is oxidized to form an oxide layer on the silicon carbide (SiC) semiconductor. A metal electrode is disposed on the oxide layer (silicon oxide) to form the MOS structure. Since the oxidation process is conducted on the silicon thin-film, the oxidation is achieved in a short time and a sharp boundary is ensured between the SiC semiconductor. Furthermore, the thickness of the oxide layer is easily controlled by controlling the thickness of the silicon thin-film.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

A silicon carbide (SiC) semiconductor 1 is first provided. An example of a method for manufacturing a silicon carbide (SiC) semiconductor substrate is disclosed in copending U.S. patent application, "METHOD FOR MAKING A SILICON CARBIDE SUBSTRATE", Ser. No. 369,911 filed on Apr. 19, 1982, now U.S. Pat. No. 4,582,561, which is a continuation in part of Ser. No. 113,963 filed on Jan. 21, 1980, now abandoned, filed by Toshinori IOKU and Takeshi SAKURAI, and assigned to the same assignee as the present application. The German counterpart was granted on Apr. 21, 1983 as DE-PS 30 02 671. A silicon thin-film 2 is deposited on the silicon carbide (SiC) semiconductor 1 through the use of the thermal decomposition of monosilane ($SiH_4$) gas. The thermal decomposition is preferably lasts for two to five minutes, and the silicon thin-film 2 preferably has a thickness of about 300 to 600 Å.

Figure 1:
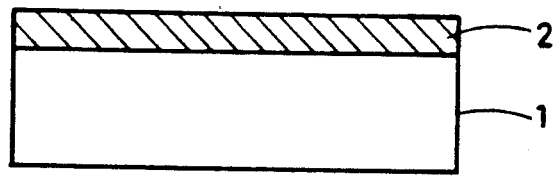
FIGS. 1 through 3 are sectional views showing manufacturing steps of an embodiment of a method for manufacturing a MOS structure on a silicon carbide (SiC) semiconductor substrate of the present invention.
Figure 2:
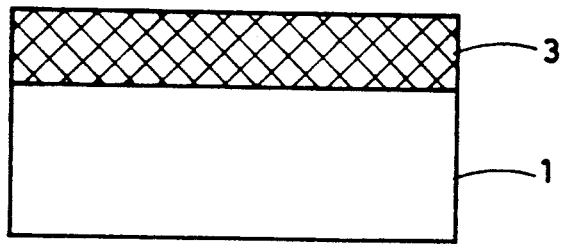

The SiC semiconductor 1 carrying the silicon thin-film 2 is, then, exposed to an oxygen gas environment to thermally oxidize the silicon thin-film 2. The oxygen gas is preferably forced to flow at a rate of about several hundreds $cm^3$/minute and is preferably maintained at about 1000° to 1100° C. The silicon thin-film 2 is thermally oxidized to form an oxide film 3 of about 600 to 1200 Å thick as shown in FIG. 2.

Figure 3:
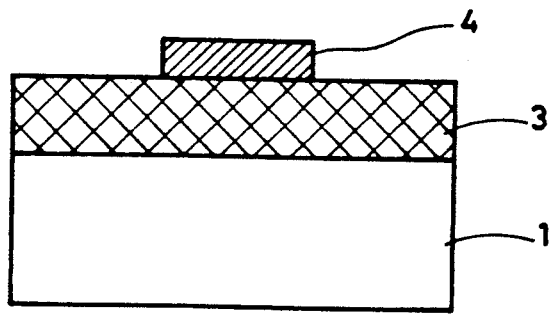

An aluminum (Al) layer 4 is disposed on the oxide film 3 as shown in FIG. 3 through the use of the evaporation method. In this way, the MOS structure is formed on the silicon carbide (SiC) semiconductor 1. The silicon oxide film 3 shows a high insulation, and forms a sharp boundary between the silicon carbide (SiC) semiconductor 1.

Of course, an impurity diffusion treatment is conducted to the SiC semiconductor 1 before the silicon thin-film 2 is deposited on the SiC semiconductor 1 so as to form the electronic circuit elements.

In the foregoing embodiment, the silicon thin-film 2 is formed through the use of the thermal decomposition of monosilane ($SiH_4$) gas. The silicon thin-film 2 can be formed by the thermal decomposition of other gases such as $SiCl_4$. Further, the silicon thin-film 2 can be deposited on the SiC semiconductor 1 through the use of a sputtering method, an evaporation method or a glow discharge method. The silicon thin-film 2 can be oxidized through the use of the thermal oxidation which utilizes steam. Further, the silicon oxide film 3 can be formed through the use of an electrolytic anodic oxidation method, or a plasma anodic oxidation method. Furthermore, the metal electrode can be formed by a metal other than aluminum (Al).

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method for making a MOS structure on a silicon carbide (SiC) semiconductor, comprising the steps of:

providing a silicon carbide (SiC) semiconductor substrate;

depositing for two to five minutes an undoped silicon thin-film through the use of the thermal decomposition of monosilane ($SiH_4$) gas in order to provide an undoped silicon thin-film having a thickness of about 300 to 600 Å on said silicon carbide (SiC) semiconductor substrate;

oxidizing all of said undoped silicon thin-film in an oxygen gas environment where the gas flow is at a rate of about several hundreds $cm^3$/minute and is maintained at about 1000° to 1100° C. so as to form an oxide film having a thickness of about 600 to 1200 Å on said silicon carbide (SiC) semiconductor substrate with a sharp boundary between said oxide film and said silicon carbide (SiC) semiconductor substrate; and disposing a metal thin-film on the portion of said oxide film corresponding to a channel region formed in said silicon carbide (SiC) substrate.

* * * * *